(12) United States Patent
Takei et al.

(10) Patent No.: US 8,354,329 B2
(45) Date of Patent: Jan. 15, 2013

(54) SEMICONDUCTOR DEVICE MANUFACTURING METHOD, SEMICONDUCTOR DEVICE AND DISPLAY APPARATUS

(75) Inventors: Michiko Takei, Osaka (JP); Yasumori Fukushima, Osaka (JP); Kazuhide Tomiyasu, Osaka (JP); Masao Moriguchi, Osaka (JP); Yutaka Takafuji, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 133 days.

(21) Appl. No.: 12/745,497

(22) PCT Filed: Nov. 14, 2008

(86) PCT No.: PCT/JP2008/003333
§ 371 (c)(1),
(2), (4) Date: May 28, 2010

(87) PCT Pub. No.: WO2009/101662
PCT Pub. Date: Aug. 20, 2009

(65) Prior Publication Data
US 2010/0283103 A1    Nov. 11, 2010

(30) Foreign Application Priority Data

Feb. 13, 2008    (JP) ................................ 2008-032016

(51) Int. Cl.
*H01L 29/786* (2006.01)
*H01L 21/762* (2006.01)

(52) U.S. Cl. ........................................ 438/458; 438/149
(58) Field of Classification Search .......... 438/149–156, 438/460–481, E29.147, E27.112
See application file for complete search history.

(56) References Cited

U.S. PATENT DOCUMENTS

| | | | |
|---|---|---|---|
| 7,176,072 B2 * | 2/2007 | Lee et al. ...................... | 438/149 |
| 2005/0236626 A1 | 10/2005 | Takafuji et al. | |
| 2005/0282019 A1 * | 12/2005 | Fukushima et al. .......... | 428/428 |
| 2006/0073678 A1 * | 4/2006 | Droes et al. ................... | 438/473 |
| 2009/0001504 A1 | 1/2009 | Takei et al. | |
| 2010/0148261 A1 | 6/2010 | Fukushima et al. | |

FOREIGN PATENT DOCUMENTS

| | | |
|---|---|---|
| JP | 2004-79645 A | 3/2004 |
| JP | 2005-277092 A | 10/2005 |
| WO | WO 2007/102248 A1 | 9/2007 |
| WO | WO 2007/111008 A1 | 10/2007 |

* cited by examiner

*Primary Examiner* — Cuong Q Nguyen
(74) *Attorney, Agent, or Firm* — Birch, Stewart, Kolasch & Birch, LLP

(57) ABSTRACT

A method for manufacturing a semiconductor device includes: a first step of forming a base layer, which includes an element portion having a gate electrode and a flat interlayer insulating film formed so as to cover the gate electrode; a second step of ion implanting a delamination material into the base layer to form a delamination layer; a third step of bonding the base layer to a substrate; and a fourth step of separating and removing a part of the base layer along the delamination layer. An implantation depth of the delamination material in the gate electrode is substantially the same as that of the delamination material in the interlayer insulating film.

16 Claims, 3 Drawing Sheets

SEMICONDUCTOR DEVICE MANUFACTURING METHOD, SEMICONDUCTOR DEVICE AND DISPLAY APPARATUS

TECHNICAL FIELD

The present invention relates to manufacturing methods of a semiconductor device, semiconductor devices, and display apparatuses.

BACKGROUND ART

In recent years, so-called active matrix drive devices for driving liquid crystal display (LCD) panels, organic electroluminescence (EL) panels, and the like are known in the art. Such active matrix drive devices are semiconductor devices in which thin film transistors (TFTs) containing amorphous silicon (amorphous Si or a-Si) or polysilicon (p-Si) are formed on arbitrary substrates larger than silicon (Si) wafers, such as glass substrates and quartz substrates. Formation of higher performance Si devices has been studied in order to integrate peripheral drivers, or systems for which higher performance is required, such as memories, microprocessors, image processors, and timing controllers, on substrates.

In particular, polysilicon has received attention as a material that is used to integrate peripheral drivers having high mobility and operating at a high speed. However, polysilicon has localized levels in bandgaps due to crystalline imperfection, and has defects and localized levels near grain boundaries, causing problems such as reduced mobility, an increased S coefficient (subthreshold coefficient), and the like.

Moreover, in the case of forming TFTs on those substrates, such as glass substrates, whose processing accuracy is lower than that of Si wafers, miniaturization of devices is limited due to the relatively low processing accuracy. This makes it difficult to integrate systems requiring more sophisticated element portions, such as memories, microprocessors, image processors, and timing controllers, on the glass substrates.

As a solution to the above problems, Patent Document 1, for example, discloses a so-called transfer technique. Specifically, an element portion having a TFT is formed by using a silicon-on-insulator (SOI) substrate, which is formed by laminating an insulating layer and a semiconductor layer on a semiconductor substrate. Then, a delamination material is ion implanted into the semiconductor substrate to form a delamination layer. The element portion formed on the semiconductor substrate is transferred and bonded to another substrate, and a part of the semiconductor substrate is separated and removed along the delamination layer. This technique enables sophisticated element portions to be integrated on glass substrates or the like.

CITATION LIST

Patent Document

PATENT DOCUMENT 1: Japanese Published Patent Application No. 2004-79645

SUMMARY OF THE INVENTION

Technical Problem

In the transfer technique, since a part of the semiconductor substrate to be transferred is separated and removed along the delamination layer, the thickness of the semiconductor layer corresponds to the shape of the delamination layer. Thus, in order to make the thickness of the semiconductor layer uniform, the delamination layer needs to be formed at a uniform depth in the semiconductor substrate in the ion implantation process.

In the ion implantation process for forming the delamination layer, if the ion implantation depth is different between a portion where a gate electrode of the TFT is formed in the semiconductor substrate, and the remaining portion of the semiconductor substrate, the delamination layer can be deformed toward the gate electrode in a region under the gate electrode in the semiconductor substrate, whereby the delamination layer can have an irregular shape in this region. If a heat treatment for delaminating a part of the semiconductor substrate is performed in this state, the semiconductor substrate can crack along the irregular shape, and the part of the semiconductor substrate may not be able to be successfully delaminated. Even if the part of the semiconductor substrate is successfully delaminated, the thickness becomes non-uniform in the region under the gate electrode, which can adversely affect device characteristics.

The present invention was developed in view of the above problems, and it is a primary object of the present invention to reduce a variation in implantation depth of a delamination material in a base layer to form a flat delamination layer.

Solution to the Problem

A method for manufacturing a semiconductor device according to the present invention includes: a first step of forming a base layer, which includes an element portion having a gate electrode and a flat interlayer insulating film formed so as to cover the gate electrode; a second step of ion implanting a delamination material into the base layer having the interlayer insulating film formed thereon, to form a delamination layer; a third step of bonding to a substrate the base layer having the element portion formed therein; and a fourth step of separating and removing along the delamination layer a part of the base layer bonded to the substrate, where the element portion is not formed, wherein an implantation depth of the delamination material in the gate electrode is substantially the same as that of the delamination material in the interlayer insulating film.

As used herein, the expression "the implantation depths are substantially the same" indicates not only that the depth the delamination material reaches in the base layer in the ion implantation process is the same in the gate electrode and in the interlayer insulating film, but also that this depth may be different between the gate electrode and the interlayer insulating film within a range in which a flat delamination layer is formed.

With this configuration, when ion implanting the delamination material into the base layer having the interlayer insulating film formed thereon, the implantation depth of the delamination material in the gate electrode is substantially the same as that of the delamination material in the interlayer insulating film. Thus, the delamination layer is formed at the same depth in a channel region located under the gate electrode in the base layer, and in the remaining region of the base layer. Accordingly, the base layer separated along the delamination layer after the transfer process has a uniform silicon thickness, whereby a device formed has satisfactory characteristics.

According to the method of the present invention, the gate electrode may be made of polysilicon containing impurities.

According to the method of the present invention, the gate electrode may further contain metal atoms.

According to the method of the present invention, a difference in implantation depth of the delamination material between the gate electrode and the interlayer insulating film may be 10 nm or less when implantation energy of the delamination material is 150 keV or higher, and may be 7 nm or less when the implantation energy is lower than 150 keV.

According to the method of the present invention, the metal atoms may be Ti, Mo, W, Ta, Co, Ni, Pt, or Rh.

According to the method of the present invention, a difference in implantation depth of the delamination material between the gate electrode and the interlayer insulating film may be 5 nm or less.

According to the method of the present invention, the base layer may include a Si layer, a gate oxide film, the gate electrode, and the interlayer insulating film may be formed over the Si layer, and a distance from a flat surface of the interlayer insulating film planarized in the first step to a surface of the Si layer may be uniform.

According to the method of the present invention, the substrate may contain Si, Ge, or a compound formed by at least two kinds of elements selected from Group III to Group V elements, in a semiconductor layer.

According to the method of the present invention, the interlayer insulating film may be made of an oxide film.

According to the method of the present invention, the delamination material may be hydrogen or helium.

According to the method of the present invention, the interlayer insulating film may be planarized by a CMP method in the first step.

The method of the present invention may further include a fifth step of thinning the base layer after the part of the base layer, where the element portion is not formed, is separated and removed in the fourth step.

The method of the present invention may further include a step of dividing the base layer into individual chips having a predetermined size after the second step, wherein the base layer of each chip may be bonded to the substrate in the third step.

A semiconductor device according to the present invention includes: a substrate; a base layer bonded to the substrate with a part of the base layer being separated and removed along a delamination layer containing a delamination material; and an element portion included in the base layer, and having a gate electrode and a flat interlayer insulating film formed so as to cover the gate electrode, wherein the interlayer insulating film is made of an oxide film, the gate electrode is made of a material containing polysilicon, and the base layer has a channel region, which is made of monocrystalline silicon, in a region facing the gate electrode.

The gate electrode may contain metal atoms.

The gate electrode may have a thickness of 1,000 nm or less.

The semiconductor device may further include a thermal oxide film as a gate oxide film.

A semiconductor device according to the present invention includes: a substrate having an insulating layer on a surface thereof; a base layer formed on the substrate; and an element portion included in the base layer, and having a gate electrode and a flat interlayer insulating film formed so as to cover the gate electrode, wherein the interlayer insulating film is made of an oxide film, the gate electrode is made of a material containing polysilicon, and the base layer has a channel region, which is made of monocrystalline silicon, in a region facing the gate electrode.

The gate electrode may contain metal atoms.

The gate electrode may have a thickness of 1,000 nm or less.

The semiconductor device may further include a thermal oxide film as a gate oxide film.

The gate electrode may have a two-layer structure in which a polysilicon layer and a metal layer are laminated together, and a value Z, which is a sum of values X and Y, may be equal to or less than the value X multiplied by 1.05, where the value X is a thickness of the polysilicon layer multiplied by specific gravity thereof, and the value Y is a thickness of the metal layer multiplied by specific gravity thereof.

The metal layer of the gate electrode may be W, Mo, Ti, Al, or Nb, or a compound of W, Mo, Ti, Al, or Nb.

According to the method of the present invention, the substrate may be a glass substrate.

A semiconductor device and a display apparatus according to the present invention include: a substrate; a base layer bonded to the substrate with a part of the base layer being separated and removed along a delamination layer containing a delamination material; and an element portion included in the base layer, and having a gate electrode and a flat interlayer insulating film formed so as to cover the gate electrode, wherein an implantation depth of the delamination material in the gate electrode is substantially the same as that of the delamination material in the interlayer insulating film.

ADVANTAGES OF THE INVENTION

The present invention can reduce a variation in implantation depth of the delamination material in the base layer, thereby enabling a flat delamination layer to be formed.

DESCRIPTION OF REFERENCE CHARACTERS

D Element Portion
10 LCD
15 Driver
20 Base Layer
23 Impurity Region
24 Monocrystalline Si Semiconductor Layer
25 Gate Oxide Film
26 Gate Electrode
27 Interlayer Insulating Film
30 Glass Substrate 35 Delamination Layer
36 Delamination Material
50 Base Layer

DESCRIPTION OF EMBODIMENTS

Embodiments of the present invention will be described in detail below with reference to the accompanying drawings. In the embodiments, a liquid crystal display (LCD) is described as an example of display apparatuses. Note that the present invention is not limited to the following embodiments.

First Embodiment

Configuration of LCD 10

Figure 1:
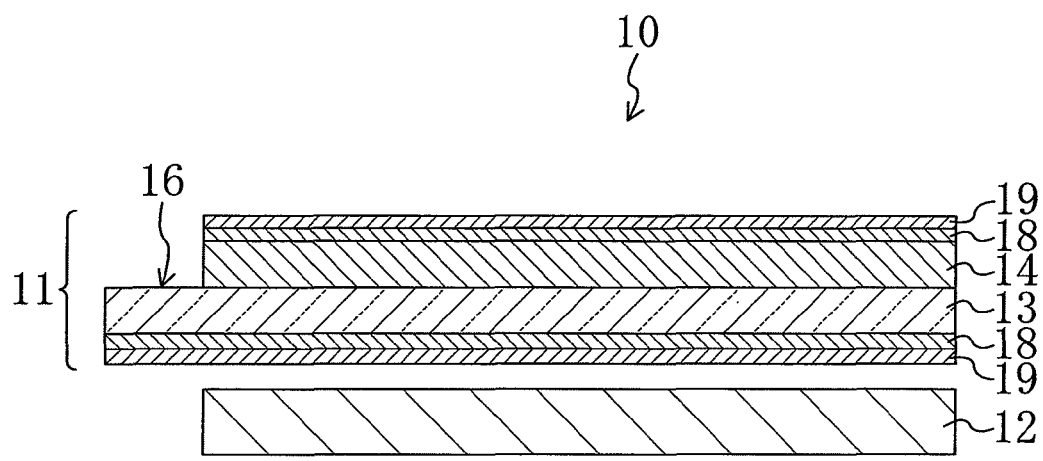
FIG. 1 is a cross-sectional view of a liquid crystal display according to a first embodiment.

FIG. 1 is a cross-sectional view of an LCD 10 according to a first embodiment of the present invention. The LCD 10 includes a liquid crystal display (LCD) panel 11, and a backlight 12 positioned on the back side of the LCD panel 11.

The LCD panel 11 has a thin film transistor (TFT) substrate 13 and a color filter (CF) substrate 14. A liquid crystal layer and spacers, which are not shown, are formed between the TFT substrate 13 and the CF substrate 14. A polarizer 18 and a protective film 19 are formed on the outer surface of the TFT substrate 13 and the outer surface of the CF substrate 14.

Red, green, and blue sub-pixels, a light shielding layer formed between the sub-pixels, and a counter electrode, which are not shown, are formed on the liquid crystal layer side (the inner side) of a glass substrate of the CF substrate 14.

Pixel regions are formed in a matrix pattern on the liquid crystal layer side (the inner side) of a glass substrate 30 of the TFT substrate 13, and pixel electrodes, TFTs, and the like are formed corresponding to the pixel regions. The TFT substrate 13 is also provided with a driver 15 in a driver formation region 16 located at an end of the TFT substrate 13.

The driver 15 is used as various functional circuits for driving and controlling a plurality of pixels of the LCD panel 11. In the present embodiment, the driver 15 is fabricated by transferring a base layer, which is formed by a separate process, onto the glass substrate 30 of the TFT substrate 13, as described below.

Figure 2:
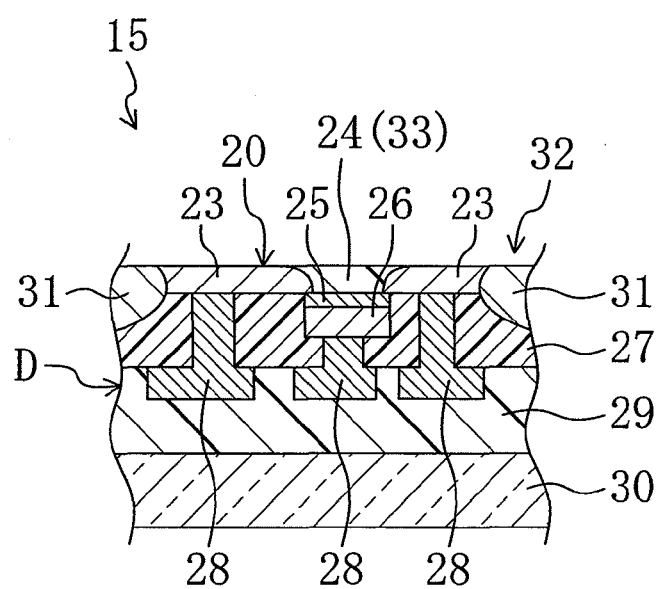
FIG. 2 is a cross-sectional view schematically showing the structure of a main part of a driver according to the first embodiment.

FIG. 2 is a cross-sectional view schematically showing the structure of a main part of the driver 15. The driver 15 includes the glass substrate 30, and element portions D formed at high density and with high accuracy in a base layer 20 over the glass substrate 30. The element portion D includes a transistor 32, and the transistor 32 is covered by a protective insulating film 29. Thus, the element portion D is bonded to the glass substrate 30 via the protective insulating film 29 by self-bonding. In other words, the base layer 20, together with the element portion D, is bonded to the glass substrate 30.

As shown in FIG. 2, the element portion D has, e.g., a metal oxide semiconductor (MOS) transistor 32 as a semiconductor element. Local oxidation of silicon (LOCOS) oxide films 31, which serve as element isolation films, are formed as element isolation regions for electrically isolating transistors 32 from each other.

Note that although the MOS transistor 32 is shown, elements that are formed are not limited to this. That is, the present invention is similarly applicable to other elements, such as bipolar transistors and diodes as well as P-channel MOS (PMOS) or N-channel MOS (NMOS) transistors. The number of elements is not limited, and one to millions of elements can be formed.

The base layer 20 has an active region. The active region has impurity regions 23 formed on both sides (the left and right sides in the figure) of a channel region 33.

The base layer 20 is a semiconductor layer such as, e.g., a monocrystalline Si semiconductor. Note that the base layer 20 may contain Ge or a compound formed by at least two kinds of elements selected from Group III to Group V elements, in a semiconductor layer, instead of the monocrystalline Si semiconductor layer.

As described below, a part of the base layer 20 is separated and removed along a delamination layer that is formed by ion implantation of a delamination material such as hydrogen.

As shown in FIG. 2, the protective insulating film 29 is laminated on the surface of the glass substrate 30. The protective insulating layer 29 is made of, e.g., ethyl acetate (tetraethoxysilane (TEOS)) or the like. An interlayer insulating film 27 is also laminated on the protective insulating film 29. The interlayer insulating film 27 is made of, e.g., an oxide film such as $SiO_2$. A gate oxide film 25 and the LOCOS oxide films 31 are formed over the interlayer insulating film 27. The gate oxide film 25 is made of, e.g., an oxide film (a thermal oxide film) such as $SiO_2$. A monocrystalline Si semiconductor layer 24 having the active region formed therein is laminated on the gate oxide film 25. Contact holes are formed so as to extend through the interlayer insulating film 27 at predetermined positions. Drain metals 28 are formed in the contact holes.

A gate electrode 26 is formed between the interlayer insulating film 27 and the gate oxide film 25. The gate electrode 26 faces the channel region 33 with the gate oxide film 25 interposed therebetween. Note that sidewalls may be provided on both sides of the gate electrode 26.

The gate electrode 26 is made of polysilicon containing impurities, and the implantation depth of the delamination material, described below, in the gate electrode 26 is substantially the same as that of the delamination material in the oxide film of the interlayer insulating film 27. The difference in implantation depth between the gate electrode 26 and the interlayer insulating film 27 is preferably 5 nm or less. The type of impurities to be contained in the gate electrode 26 depends on the type of the transistor 32 to be formed. For example, phosphorus (P) ions, arsenic (As) ions, antimony (Sb) ions, bismuth (Bi) ions, or the like can be used as n-type impurities. Boron (B) ions, aluminum (Al) ions, gallium (Ga) ions, indium (In) ions, or the like can be used as p-type impurities.

The thickness of the gate electrode 26 is preferably 1,000 nm or less, more preferably 500 nm or less, and more desirably 200 nm or less.

Note that FIG. 2 schematically shows the structure of the main part of the driver 15 as described above. In fact, the driver 15 is fabricated by further performing various processes, such as formation of contacts for electrical connection to the outside, formation of interconnect metals, and the like.

[Manufacturing Method]

A manufacturing method of the LCD 10 will be described below.

Figure 3:
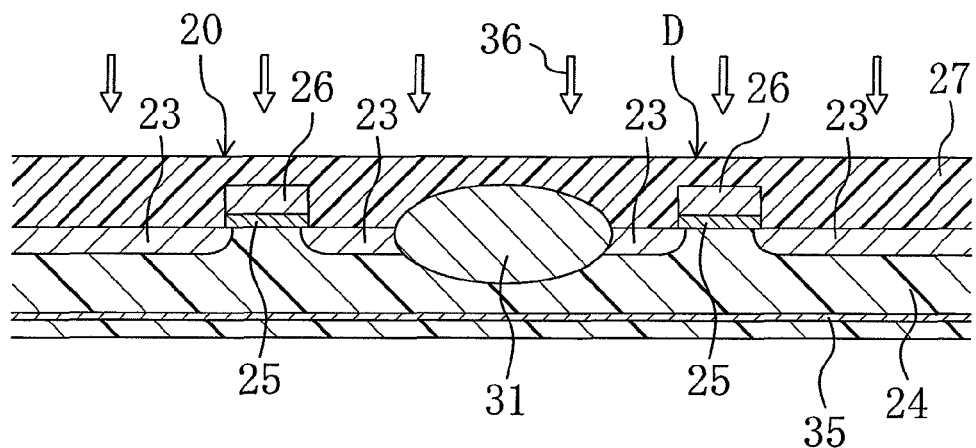
FIG. 3 is a cross-sectional view showing a delamination layer formed in a base layer according to the first embodiment.

First, as shown in FIG. 3, element portions D, each including at least a part of a MOS transistor 32, are formed in a base layer 20 including, e.g., a monocrystalline Si semiconductor layer 24. That is, the element portions D are formed in a wafer of a Si substrate (which corresponds to the base layer 20) made of a monocrystalline Si semiconductor.

Next, the Si substrate is heat treated, e.g., at about 900 to 1,000° C. in an oxygen atmosphere to form LOCOS oxide films 31. Then, a heat treatment is further performed, e.g., at about 1,000° C. in an oxygen atmosphere to form gate oxide films 25 having a thickness of about 20 nm as insulating films on the Si substrate.

Subsequently, gate electrodes 26 are formed with a thickness of, e.g., about 300 nm on the surface of the gate oxide films 25 by using polysilicon. Then, n-type or p-type impurity ions are implanted into regions located on both sides of each gate electrode 26 as a gate region in the Si substrate, and a heat treatment is performed, e.g., at 900° C. for about one hour to form source regions and drain regions (impurity regions 23).

Then, an oxide film, such as $SiO_2$, is formed with a thickness of, e.g., 0.5 to 1.0 μm, and is planarized by a chemical mechanical polishing (CMP) method to form an interlayer insulating film 27. The distance from the flat surface of the interlayer insulating film 27 to the surface of the monocrystalline Si semiconductor layer 24 of the Si substrate is made uniform in this manner.

Then, a delamination material 36 is ion implanted into the Si substrate from the interlayer insulating film 27 side. Hydrogen or helium is used as the delamination material 36. In the Si substrate, the interlayer insulating film 27 is made of an oxide film, and the implantation depth of the delamination material 36 in the interlayer insulating film 27 is substantially the same as that of the delamination material 36 in the gate electrodes 26. Moreover, the distance from the flat surface of the interlayer insulating film 27 to the surface of the monocrystalline Si semiconductor layer 24 of the Si substrate is uniform. Thus, by implantation of the delamination material 36, a delamination layer 35 is formed at a uniform depth in the monocrystalline Si semiconductor layer 24.

Figure 4:
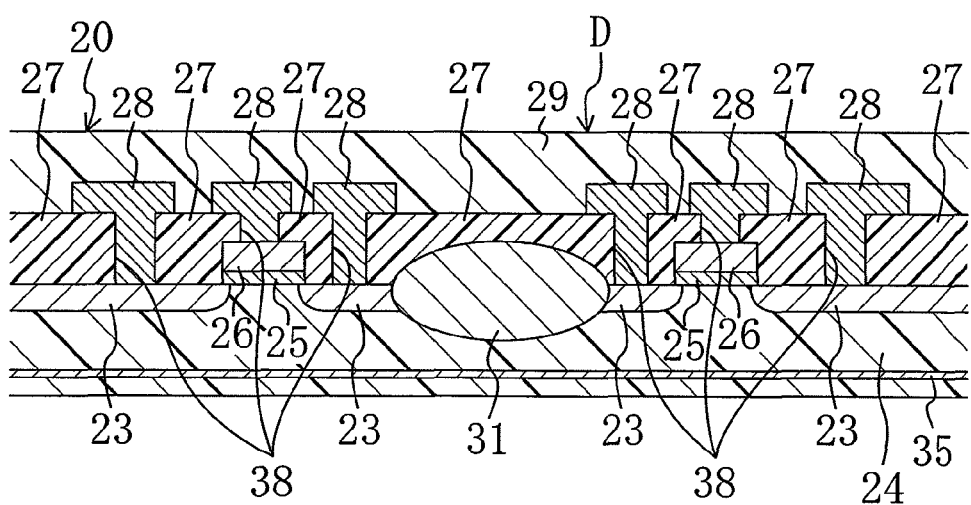
FIG. 4 is a cross-sectional view showing an element portion formed in the base layer according to the first embodiment.

Thereafter, as shown in FIG. 4, contact holes 38 are formed in the interlayer insulating film 27 so as to reach the impurity regions 23 and the gate electrode 26. The contact holes 38 are filled with a metal material to form drain metals 28.

Then, a TEOS film or the like is formed with a thickness of, e.g., 1.0 to 5.0 μm over the surface of the interlayer insulating film 27 so as to cover the MOS transistors 32, and the surface of the TEOS film is planarized by a CMP method to form a protective insulating film 29. In this manner, the element portions D are formed in the base layer 20 as the Si substrate.

Figure 5:
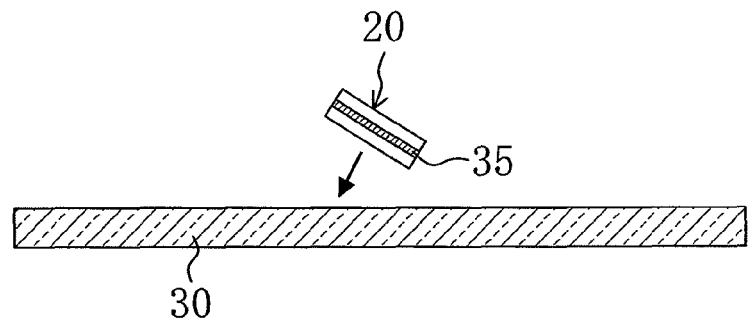
FIG. 5 is a cross-sectional view of a glass substrate to which a divided base layer is bonded according to the first embodiment.

Then, the Si substrate having the element portions D formed therein is divided into individual chips to form chip-shaped base layers 20. As shown in FIG. 5, each chip-shaped base layer 20 is bonded to a glass substrate 30 so that the element portion D faces the glass substrate 30. The glass substrate 30 forms a TFT substrate 13, and the base layer 20 is bonded to the periphery of a display region of the TFT substrate 13.

When bonding the base layer 20, the surface of the protective insulating film 29, which is the surface to be bonded to the glass substrate 30, is first polished and planarized in advance by a CMP method or the like. Then, the surface of the protective insulating film 29 and the surface of the glass substrate 30 are cleaned. Subsequently, the element portion D is aligned with the glass substrate 30, and the base layer 20 and the glass substrate 30 are bonded together at the surface of the protective insulating film 29 by self-bonding due to the van der Waals force.

Then, the base layer 20 bonded to the glass substrate 30 is heated to about 400 to 600° C. to separate and remove a part of the base layer 20 (i.e., a part which is located on a side opposite to the gate electrode 26 with the delamination layer 35 therebetween, and where the element portion D is not formed) along the delamination layer 35. As a result, the MOS transistor 32 is transferred onto the glass substrate 30.

Thereafter, the delamination layer 35 is removed by etching or the like, and the base layer 20 is thinned by etching, CMP, or the like until the LOCOS oxide films 31 are exposed, whereby element isolation is performed. The driver 15, whose main part is shown in FIG. 2, is manufactured in this manner.

Then, a CF substrate 14, which is formed separately, is bonded to the TFT substrate 13, and a liquid crystal material is injected into the cell gap formed therebetween. A polarizer 18 and a protective film 19 are formed on the outer surface of the TFT substrate 13 and the outer surface of the CF substrate 14, and a backlight is provided on the TFT substrate 13 side, whereby the LCD 10 is completed.

Advantages of First Embodiment

According to the first embodiment of the present invention, since the implantation depth of the delamination material 36 in the gate electrode 26 is substantially the same as that of the delamination material 36 in the interlayer insulating film 27, a flat delamination layer 35 is formed. That is, the delamination layer 35 is formed at the same depth in the channel region 33 located under the gate electrode 26 in the base layer 20, and in the remaining region of the base layer 20. Thus, in the separation process after the transfer process, the channel region 33 does not crack, and a part of the base layer 20 can be uniformly separated. Moreover, the base layer 20 separated along the delamination layer 35 after the transfer process has a uniform silicon thickness, whereby the LCD 10 has satisfactory characteristics.

Since the gate electrode 26 is made of polysilicon containing impurities, the implantation depth of the delamination material 36 in the gate electrode 26 is closer to that of the delamination material 36 in the oxide film of the interlayer insulating film 27. Thus, the delamination layer 35 can be more easily formed at a uniform depth.

Since the difference in implantation depth of the delamination material 36 between the gate electrode 26 and the interlayer insulating film 27 is 5 nm or less, the delamination layer 35 can be more easily formed at a uniform depth.

When manufacturing the base layer 20, the distance from the flat surface of the interlayer insulating film 27 to the surface of the monocrystalline Si semiconductor layer 24 of the Si substrate is made uniform before implantation of the delamination material 36. Thus, the delamination layer 35 can be more easily formed at a uniform depth.

Like the LOCOS oxide films 31 and the gate oxide films 25 formed in the base layer 20, the interlayer insulating film 27 is made of an oxide film. Thus, the implantation depth of the delamination material 36 in the LOCOS oxide films 31, the implantation depth of the delamination material 36 in the gate oxide films 25, and the implantation depth of the delamination material 36 in the interlayer insulating film 27 are the same. Thus, the delamination layer 35 can be more easily formed at a uniform depth.

Second Embodiment

Figure 6:
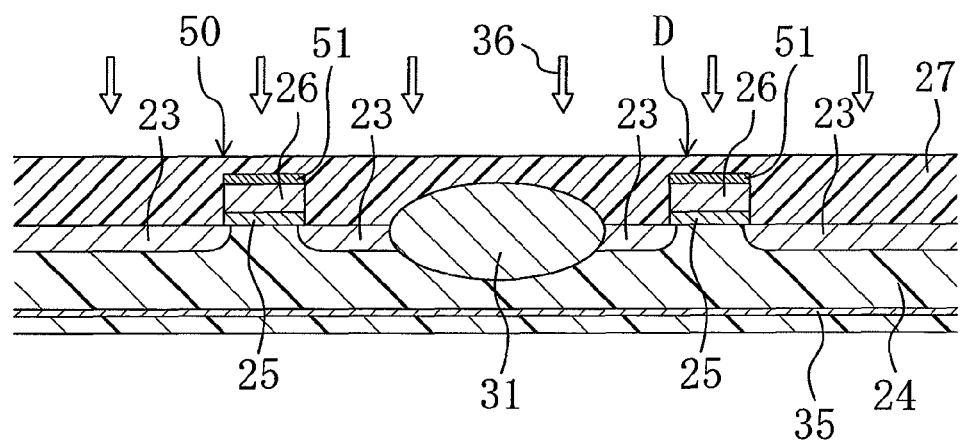
FIG. 6 is a cross-sectional view showing a delamination layer formed in a base layer according to a second embodiment.

A second embodiment of the present invention will be described with reference to FIG. 6. In FIG. 6, components similar to those of the first embodiment are denoted by the same reference characters.

A manufacturing method of an LCD of the second embodiment is different from that of the first embodiment in that a metal film is formed on the gate electrodes 26 before implantation of the delamination material 36.

More specifically, as shown in FIG. 6, when manufacturing element portions D, gate electrodes 26 are formed by polysilicon, and a metal film (e.g., Ti) is formed on the gate electrodes 26. Thus, the gate electrodes 26 have a two-layer structure in which the polysilicon layer and the metal film are laminated together. A heat treatment is performed to form TiSi in the gate electrodes 26. Thus, the gate electrodes 26 contain metal atoms.

A value Z, which is the sum of values X and Y, is equal to or less than the value X multiplied by 1.05. The value X is the thickness of the polysilicon layer of the gate electrode 26 multiplied by the specific gravity of the polysilicon layer, and the value Y is the thickness of the metal film (a metal layer) of the gate electrode 26 multiplied by the specific gravity of the metal film.

Then, impurity ions are implanted to form source regions and drain regions (impurity regions 23), and an oxide film, such as SiO$_2$, is formed. The oxide film is planarized by a CMP method to form an interlayer insulating film 27.

Subsequently, a delamination material 36 is ion implanted into a Si substrate from the interlayer insulating film 27 side. Hydrogen or helium is used as the delamination material 36. Like LOCOS oxide films 31 and gate oxide films 25, the interlayer insulating film 27 of the Si substrate is made of an oxide film. Thus, the implantation depth of the delamination material 36 in the LOCOS oxide films 31, the implantation depth of the delamination material 36 in the gate oxide films 25, and the implantation depth of the delamination material 36 in the interlayer insulating film 27 are substantially the same. Moreover, the distance from the flat surface of the interlayer insulating film 27 to the surface of a monocrystalline Si semiconductor layer 24 of the Si substrate is uniform. Thus, by implantation of the delamination material 36, a delamination layer 35 can be formed at a uniform depth in the monocrystalline Si semiconductor layer 24.

Thereafter, as in the first embodiment, contact holes 38, drain metals 28, and the like are formed to fabricate MOS transistors 32, and a protective insulating film 29 is formed so as to cover the MOS transistors 32. In this manner, element portions D are formed in a base layer 50 as a Si substrate, and a divided base layer 50 having the element portion D formed therein is bonded to a glass substrate 30 of a TFT substrate 13 to fabricate a driver 15. Then, processes similar to those of the first embodiment are performed to fabricate the LCD of the second embodiment.

The difference in implantation depth of the delamination material 36 between the gate electrode 26 and the interlayer insulating film 27 in the second embodiment is 10 nm or less when the implantation energy of the delamination material 36 is 150 keV or higher, and is 7 nm or less when the implantation energy is lower than 150 keV.

Note that the metal film that is formed on the gate electrodes 26 may be Mo, W, Ti, Al, Nb, Ta, Co, Ni, Pt, or Rh, or a compound of Mo, W, Ti, Al, Nb, Ta, Co, Ni, Pt, or Rh.

Advantages of Second Embodiment

In the second embodiment of the present invention, the gate electrodes 26 contain metal atoms. The difference in implantation depth of the delamination material 36 between the gate electrode 26 and the interlayer insulating film 27 is 10 nm or less when the implantation energy of the delamination material 36 is 150 keV or higher, and is 7 nm or less when the implantation energy is lower than 150 keV. Thus, the implantation depth of the delamination material 36 in the gate electrodes 26 is substantially the same as that of the delamination material 36 in the interlayer insulating film 27, and a flat delamination layer 35 is formed. That is, the delamination layer 35 is formed at the same depth in the channel regions 33 located under the gate electrodes 26 in the base layer 50, and in the remaining region of the base layer 50. Thus, the base layer 50 separated along the delamination layer 35 after the transfer process has a uniform silicon thickness, whereby the LCD has satisfactory characteristics.

Comparative Example

Figure 7:
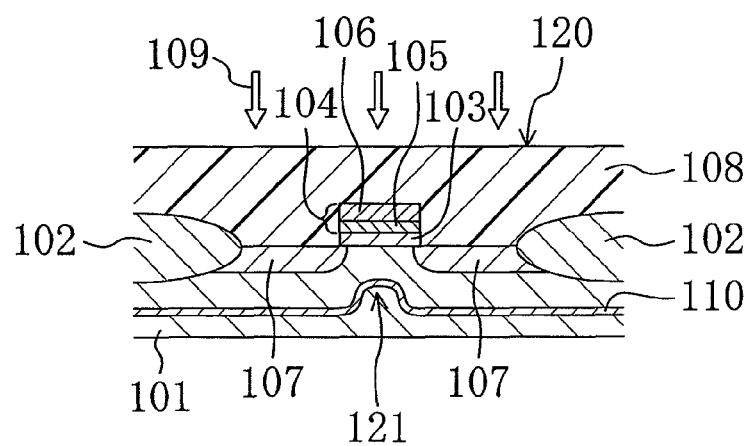
FIG. 7 is a cross-sectional view showing a delamination layer formed in a base layer according a comparative example.

As a comparative example, the inventors examined transfer of an element portion that includes a transistor having a gate electrode formed by laminating a polysilicon layer and a WSi layer or the like, as shown in FIG. 7. More specifically, as shown in FIG. 7, a monocrystalline Si TFT of an element portion 120 was first formed on a Si substrate 101. That is, LOCOS oxide films 102, which serve as element isolation films, and a gate insulating film 103 were formed on the surface of the Si substrate 101, and a gate electrode 104 was formed on the gate insulating film 103. The gate electrode 104 is formed by laminating a polysilicon layer 105 and a WSi layer 106 or the like.

Then, an impurity element was ion implanted into the Si substrate 101 to form impurity regions 107.

Thereafter, an interlayer insulating film 108 was formed over the Si substrate 101 so as to cover the gate electrode 104 and the like, and hydrogen ions 109 were implanted into the Si substrate 101 via the interlayer insulating film 108. In this manner, a delamination layer 110 containing the hydrogen ions 109 was formed in the Si substrate 101.

As described above, in the comparative example, the element portion 120 includes the transistor having the gate electrode 104 formed by laminating the polysilicon layer 105 and the WSi layer 106 or the like. Thus, when implanting the hydrogen ions 109 to form the delamination layer 110, the implantation depth of the hydrogen ions 109 is different between the portion where the gate electrode 104 is formed in the Si substrate 101, and the remaining portion of the Si substrate 101. As a result, the delamination layer 110 was significantly deformed toward the gate electrode 104 in a channel region located under the gate electrode 104 in the Si substrate 101, whereby the delamination layer 110 had an irregular shape 121. Such an irregular shape 121 makes the silicon thickness in the channel region non-uniform, which adversely affects characteristics of a device that is formed.

On the other hand, in the first and second embodiments of the present invention, the implantation depth of the delamination material in the gate electrode is substantially the same as that of the delamination material in the interlayer insulating film. Thus, a flat delamination layer is formed without any irregular shape. This enables the base layer separated along the delamination layer after the transfer process to have a satisfactorily uniform silicon thickness, whereby superior functions and effects can be obtained as compared to the comparative example.

Note that although an LCD is described as an example of display apparatuses in the first and second embodiments, the present invention is not limited to this. The present invention is also applicable to other display apparatuses including a plasma display (PD), a plasma addressed liquid crystal (PALC) display, an organic electroluminescence (EL) display, an inorganic EL display, a field emission display (FED), a surface-conduction electron-emitter display (SED), or the like.

Although the glass substrate 30 is described as an example of the substrate to which the base layer 20, 50 is bonded in the first and second embodiments, the present invention is not limited to this. The present invention is also applicable to substrates having an insulating layer formed on a surface thereof. In this case, the substrate may be a conductive substrate since the insulating layer is formed on its surface.

INDUSTRIAL APPLICABILITY

As described above, the present invention is useful for manufacturing methods of a semiconductor substrate, semiconductor devices, and display apparatuses.

The invention claimed is:

1. A method for manufacturing a semiconductor device, comprising:
   forming a base layer, which includes an element portion having a gate oxide film, a gate electrode and a flat interlayer insulating film formed so as to cover the gate electrode;
   ion implanting a delamination material into the base layer having the interlayer insulating film formed thereon, to form a delamination layer;
   bonding to a substrate the base layer having the element portion formed therein; and
   separating and removing along the delamination layer a part of the base layer bonded to the substrate, where the element portion is not formed, wherein
   pursuant to said ion implanting step, an implantation depth of the delamination material in a cross-section of the device including the stacked gate electrode and gate oxide film is substantially the same as the implantation depth of the delamination material in another cross-section of the device including the interlayer insulating film and a source or drain region but not including the gate oxide film.

2. The method of claim 1, wherein
   the gate electrode is made of polysilicon containing impurities.

3. The method of claim 2, wherein
   the gate electrode further contains metal atoms.

4. The method of claim 3, wherein
   a difference in implantation depth of the delamination material between the gate electrode and the interlayer insulating film is 10 nm or less when implantation energy of the delamination material is 150 keV or higher, and is 7 nm or less when the implantation energy is lower than 150 keV.

5. The method of claim 3, wherein
   the metal atoms are Ti, Mo, W, Ta, Co, Ni, Pt, or Rh.

6. The method of claim 1, wherein
   a difference in implantation depth of the delamination material between the gate electrode and the interlayer insulating film is 5 nm or less.

7. The method of claim 1, wherein
   the base layer includes a Si layer,
   a gate oxide film, the gate electrode, and the interlayer insulating film are formed over the Si layer, and
   a distance from a flat surface of the interlayer insulating film planarized in the first step to a surface of the Si layer is uniform.

8. The method of claim 1, wherein
   the substrate contains Si, Ge, or a compound formed by at least two kinds of elements selected from Group III to Group V elements, in a semiconductor layer.

9. The method of claim 1, wherein
   the interlayer insulating film is made of an oxide film.

10. The method of claim 1, wherein
    the delamination material is hydrogen or helium.

11. The method of claim 1, wherein
    the interlayer insulating film is planarized by a CMP method in the first step.

12. The method of claim 1, further comprising:
    a fifth step of thinning the base layer after the part of the base layer, where the element portion is not formed, is separated and removed in the fourth step.

13. The method of claim 1, further comprising:
    a step of dividing the base layer into individual chips having a predetermined size after the second step, wherein
    the base layer of each chip is bonded to the substrate in the third step.

14. The method of claim 1, wherein
    the substrate is a glass substrate.

15. The method of claim 1, wherein the base layer contains Si, Ge, or a compound formed by at least two kinds of elements selected from Group III to Group V elements, in a semiconductor layer.

16. A method for manufacturing a semiconductor device, comprising:
    forming a base layer, which includes an element isolation film, and an element portion having a gate electrode, a gate oxide film, and a flat interlayer insulating film formed so as to cover the gate electrode, the element isolation film having a different height than the gate oxide film;
    ion implanting a delamination material into the base layer having the interlayer insulating film formed thereon, to form a delamination layer;
    bonding to a substrate the base layer having the element portion formed therein; and
    separating and removing along the delamination layer a part of the base layer bonded to the substrate, where the element portion is not formed, wherein
    pursuant to said ion implanting step, implantation depths of the delamination material are substantially the same
      in a first device cross-section including the element isolation film,
      in a second device cross-section including the gate electrode and the gate oxide film, and
      in a third device cross-section including the interlayer insulating film.

* * * * *